(12) United States Patent
Hensel et al.

(10) Patent No.: US 9,312,424 B1
(45) Date of Patent: Apr. 12, 2016

(54) PROCESS AND SYSTEM FOR PRODUCING PHOTOVOLTAIC MODULES

(71) Applicant: PPG Industries Ohio, Inc., Cleveland, OH (US)

(72) Inventors: Gereme Hensel, Pittsburgh, PA (US); Steven Wirtz, Gibsonia, PA (US); Walter J Robertson, Pittsburgh, PA (US)

(73) Assignee: PPG industries Ohio, Inc., Cleveland, OH (US)

( * ) Notice: Subject to any disclaimer, the term of this patent is extended or adjusted under 35 U.S.C. 154(b) by 0 days.

(21) Appl. No.: 14/571,617

(22) Filed: Dec. 16, 2014

(51) Int. Cl.
| | | |
|---|---|---|
| H01L 31/049 | (2014.01) | |
| H01L 31/18 | (2006.01) | |
| H01L 31/048 | (2014.01) | |
| H01L 31/028 | (2006.01) | |
| H01L 31/0475 | (2014.01) | |
| H01L 23/31 | (2006.01) | |

(52) U.S. Cl.
CPC ........ *H01L 31/1876* (2013.01); *H01L 23/3135* (2013.01); *H01L 31/028* (2013.01); *H01L 31/049* (2014.12); *H01L 31/0475* (2014.12); *H01L 31/0481* (2013.01)

(58) Field of Classification Search
CPC .................. H01L 21/02109; H01L 21/02345; H01L 23/22
See application file for complete search history.

(56) References Cited

U.S. PATENT DOCUMENTS

2013/0240019 A1* 9/2013 Shao .................. H01L 31/02167
136/251

* cited by examiner

*Primary Examiner* — Cheung Lee
(74) *Attorney, Agent, or Firm* — William E. Kuss

(57) ABSTRACT

A photovoltaic module can be produced by suspending a photovoltaic cell with a front side of the photovoltaic cell facing upward, positioning a backsheet and a first encapsulant layer underneath the suspended photovoltaic cell, lowering the suspended photovoltaic cell into contact with the first encapsulant layer wherein a back side of the photovoltaic cell contacts the first encapsulant layer, applying a second encapsulant layer over at least the front side of the photovoltaic cell, positioning a front transparency onto the second encapsulant layer, and curing the first encapsulant layer and the second encapsulant layer.

20 Claims, 16 Drawing Sheets

PROCESS AND SYSTEM FOR PRODUCING PHOTOVOLTAIC MODULES

TECHNICAL FIELD

This specification relates to processes and systems for producing photovoltaic modules. This specification also relates to photovoltaic modules produced by the processes and systems.

BACKGROUND

The information described in this background section is not admitted to be prior art.

Photovoltaic modules can comprise at least one photovoltaic cell encapsulated and laminated between a front transparency and a backsheet. The production of such photovoltaic modules can comprise the fabrication of a module preassembly that undergoes a vacuum lamination operation to seal encapsulant material and adhere together the constituent components. Lamination of a module preassembly can be performed by placing the module preassembly in a vacuum lamination apparatus that uses a compliant diaphragm to compress the module preassembly and bond the encapsulant materials under reduced pressure and elevated temperature conditions to produce the laminated photovoltaic module. The lamination operation seals the photovoltaic cells between the front transparency and the backsheet with bonded encapsulant material.

Vacuum lamination operations for producing photovoltaic modules can require large capital investments in equipment and control systems. Additionally, the mechanical compression required during vacuum lamination operations can crack silicon semiconductor photovoltaic cells, which are intrinsically brittle and fragile, leading to undesirably high rates of breakage and device rejection during production. Accordingly, it would be advantageous to provide processes and systems for producing photovoltaic modules that do not require vacuum lamination operations.

SUMMARY

A process for producing a photovoltaic module comprises suspending a photovoltaic cell with a front side of the photovoltaic cell facing upward, positioning a backsheet and a first encapsulant layer underneath the suspended photovoltaic cell, lowering the suspended photovoltaic cell into contact with the first encapsulant layer wherein a back side of the photovoltaic cell contacts the first encapsulant layer, applying a second encapsulant layer over at least the front side of the photovoltaic cell, positioning a front transparency onto the second encapsulant layer, and curing the first encapsulant layer and the second encapsulant layer.

A process for producing a photovoltaic module comprises suspending a photovoltaic cell matrix comprising a plurality of electrically interconnected photovoltaic cells wherein front sides of the photovoltaic cells face upward when suspended, positioning a backsheet and a first encapsulant layer underneath the suspended photovoltaic cell matrix, lowering the suspended photovoltaic cell matrix into contact with the first encapsulant layer wherein back sides of the photovoltaic cells contact the first encapsulant layer, applying a second encapsulant layer over at least the front sides of the photovoltaic cells and the electrical interconnections, positioning a front transparency onto the second encapsulant layer, and curing the first encapsulant layer and the second encapsulant layer.

It is understood that the invention disclosed and described in this specification is not limited to the aspects summarized in this Summary.

BRIEF DESCRIPTION OF THE DRAWINGS

Various aspects of processes, systems, and photovoltaic modules disclosed and described in this specification can be better understood by reference to the accompanying figures, in which.

The reader will appreciate the foregoing aspects, as well as others, upon considering the following detailed description of the processes, systems, and photovoltaic modules according to this specification.

DESCRIPTION

Processes for producing photovoltaic modules described in this specification can comprise sequential back-to-front production. As used in this specification in connection with photovoltaic cells and modules, and their production, the term "front" refers to the sides or surfaces of the constructs that face outwardly toward incident light in operation, and the term "back" refers to the sides or surfaces of the constructs that face away from incident light in operation.

Figure 1:
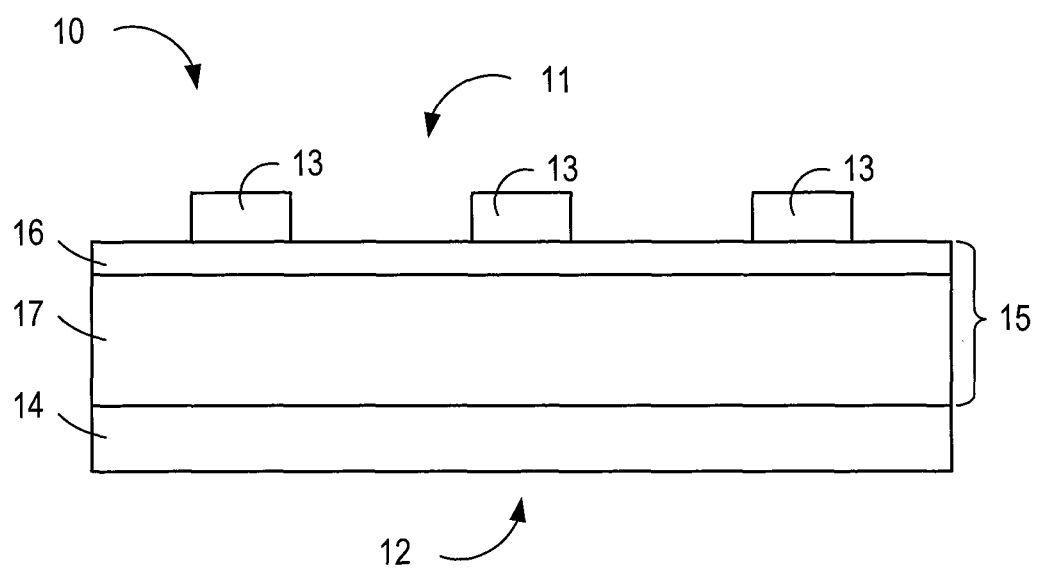
FIG. 1 is a schematic diagram in side cross-sectional view, not to scale, of a photovoltaic cell comprising a p-doped and n-doped silicon wafer, a front contact deposited onto a front surface of the silicon wafer, and a back contact deposited onto a back surface opposite the front surface of the silicon wafer.

For example, referring to FIG. 1, a photovoltaic cell 10 comprises a planar-shaped structure having a front side 11 and a back side 12. The back side 12 of the photovoltaic cell 10 can be located opposite to the front side 11, as shown. The photovoltaic cell 10 comprises electrical contacts 13 and 14 positioned on opposite sides of an n-doped and p-doped silicon semiconductor wafer 15. The front contacts 13 can be positioned on the front side of the silicon semiconductor wafer 15 in contact with an n-doped region 16. The back contact 14 can be positioned on the back side of the silicon semiconductor wafer 15 in contact with an p-doped region 17. The front side 11 of the photovoltaic cell 10 can be configured to absorb incident light that passes into the silicon semiconductor wafer 15 to photovoltaically generate charge carriers.

Figure 2:
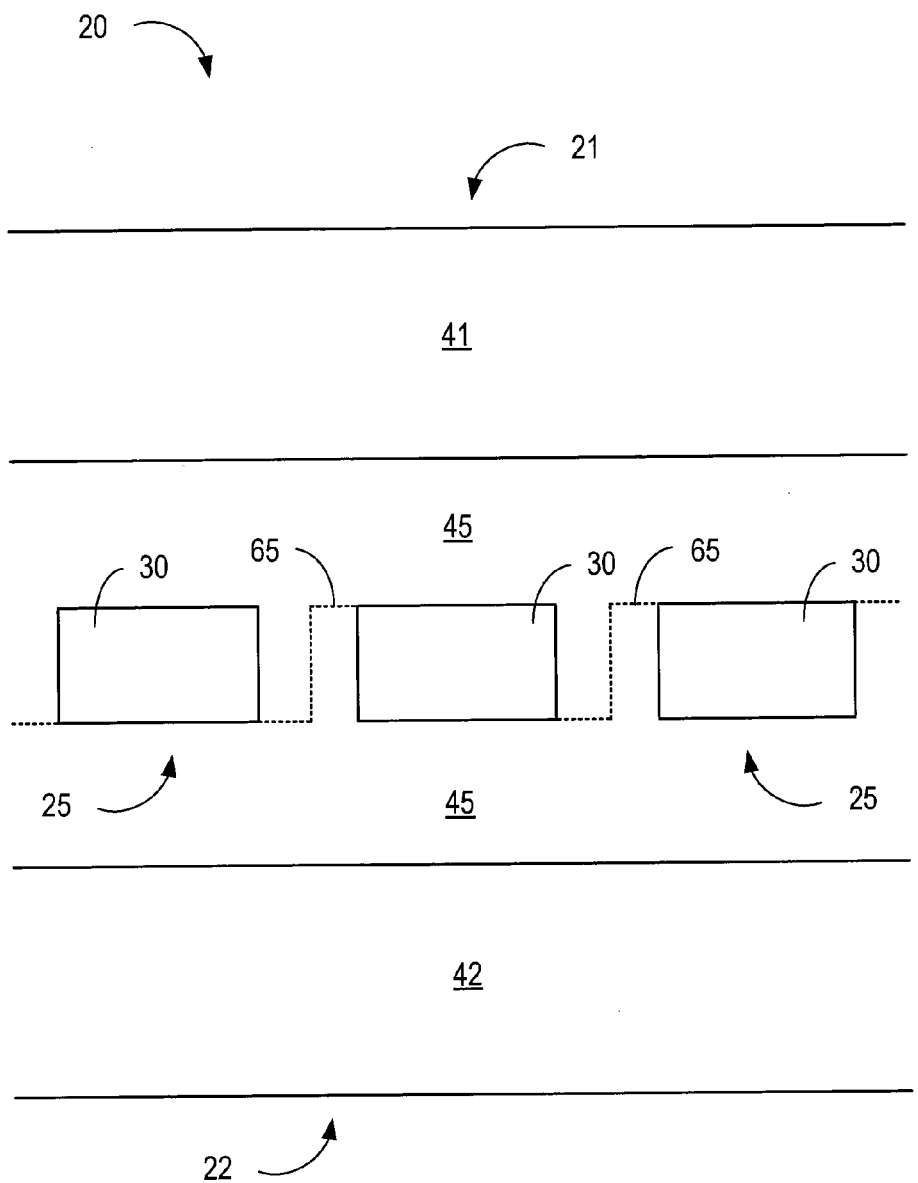
FIG. 2 is a schematic diagram in side cross-sectional view, not to scale, of a portion of a photovoltaic module comprising a photovoltaic cell matrix comprising a plurality of electrically interconnected photovoltaic cells.

A photovoltaic module can comprise a photovoltaic cell located between a front transparency and a backsheet. For example, referring to FIG. 2, a photovoltaic module 20 comprises a photovoltaic cell matrix 25 comprising a plurality of photovoltaic cells 30 connected via electrical interconnections 35. The photovoltaic cell matrix 25 can be located within an encapsulant material layer 45 that bonds to and adheres together a front transparency 41 and a backsheet 42. The front transparency 41 forms the front surface/side 21 of the photovoltaic module 20, and the backsheet 42 forms the back surface/side 22 of the photovoltaic module 20.

A back-to-front photovoltaic module production process can begin with a backsheet, optionally comprising a rim located around the perimeter of the backsheet. For example, referring to FIGS. 3A and 3B, a backsheet 52 comprises a rim 54 around the perimeter of the backsheet 52. The rim 54 projects from and surrounds a front planar surface 56 of the backsheet 52. The rim 54 and the front planar surface 56 together define a volume 55 in which other components of a photovoltaic module can be positioned during downstream production steps.

Figure 3A:
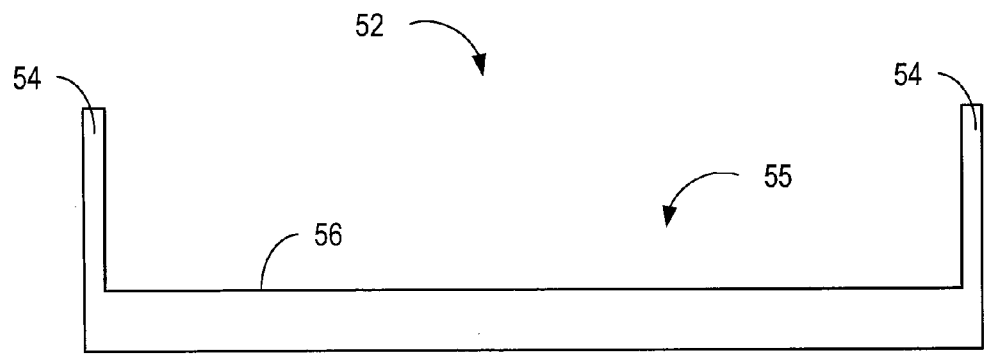
FIG. 3A is a schematic diagram in side cross-sectional view, not to scale, of a photovoltaic module backsheet comprising a rim around the perimeter of the backsheet.
Figure 3B:
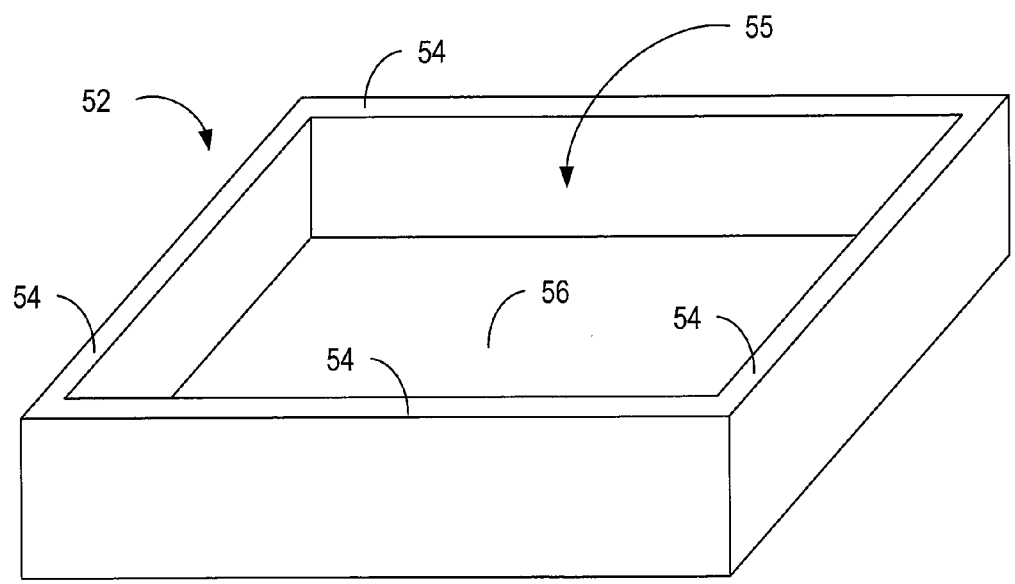
FIG. 3B is a schematic diagram in perspective view, not to scale, of the photovoltaic module backsheet shown in FIG. 3A.

A backsheet such as, for example, backsheet 52 shown in FIGS. 3A and 3B, can comprise materials including, but not limited to, a glass sheet, a metal sheet or foil, or a polymer sheet such as a poly(vinyl fluoride) (PVF) sheet, a poly(tetrafluoroethylene) (PTFE) sheet, poly(ethylene-tetrafluoroethylene) (PETFE) sheet, a poly(ethylene terephthalate) (PET) sheet, a polyester sheet, a polysiloxane sheet, a polyurethane sheet, a polyurea sheet, a poly(urethane-urea) sheet, or combinations of any thereof. In some aspects, a backsheet such as, for example, backsheet 52 shown in FIGS. 3A and 3B, can comprise a pre-formed polymer sheet. A backsheet can be pre-formed using any suitable production technique such as, for example, casting a liquid/molten resin into an appropriately shaped mold and solidifying/curing the resin. For example, suitable thermosetting liquid polyurea or poly(urethane-urea) compositions that can be cast and cured to form a pre-cured backsheet include those described in U.S. patent application Ser. No. 14/484,919, to Hensel et al., filed Sep. 12, 2014, which is incorporated by reference into this specification. For backsheets comprising rims around the perimeter, as described above, the rim portion can be cast and solidified/cured simultaneously with the planar portion in an appropriately shaped mold, thereby forming a seamless pre-formed backsheet comprising an integral perimeter rim.

Figure 4:
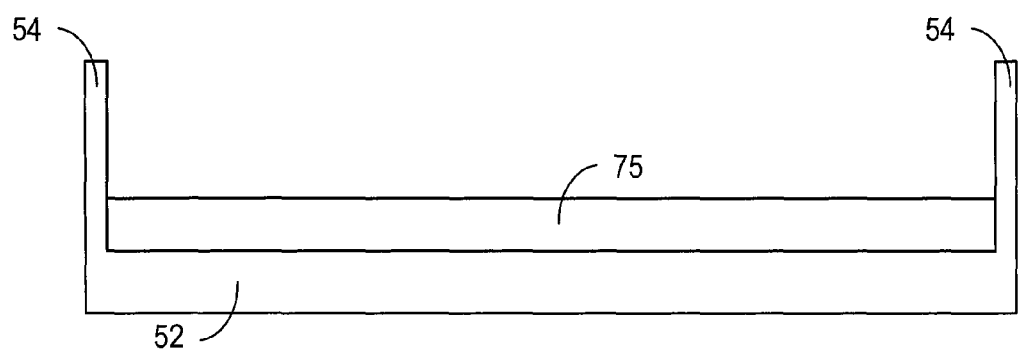
FIG. 4 is a schematic diagram in side cross-sectional view, not to scale, of an encapsulant layer applied to a photovoltaic module backsheet comprising a perimeter rim surrounding the encapsulant layer.

A photovoltaic module production process can comprise applying a first encapsulant layer onto a backsheet. As shown, for example, in FIG. 4, a first encapsulant layer 75 can be applied onto a backsheet 52, wherein the backsheet 52 comprises rim 54 around the perimeter of the backsheet. The rim 54 surrounds the first encapsulant layer 75 located on the front planar surface 56 and within the volume 55 of the backsheet 52 (see FIG. 3). The first encapsulant layer can comprise a pre-formed solid sheet of encapsulant material that can be applied onto the backsheet. Alternatively, the first encapsulant layer can comprise a liquid encapsulant material that can be applied onto the backsheet as a deposited liquid coating layer that can be subsequently cured in a later curing step. The optional rim portion of a backsheet can contain a deposited liquid coating layer on the front planar surface (within the volume formed by the front planar surface together with the rim) during subsequent production steps before and after the deposited liquid coating layer is cured to form a solid encapsulant layer. Liquid encapsulant materials can be applied onto a backsheet using a coating deposition operation such as, for example, spray coating, dip coating, roll coating, brush coating, roller coating, curtain coating, flow coating, cylindrical hole coating, and slot die coating.

In another aspect, the first encapsulant layer can comprise a powder coating composition applied onto the back sheet as a deposited powder coating layer than can be subsequently cured in a later curing step. The optional rim portion of a backsheet can contain a deposited powder coating layer on the front planar surface (within the volume formed by the front planar surface together with the rim) during subsequent production steps before and after the deposited powder coating layer is cured to form a solid encapsulant layer. Powder coatings can be applied onto a backsheet using electrostatic deposition or other suitable powder coating deposition techniques.

The first encapsulant layer can comprise, for example, a pre-formed solid ethylene vinyl acetate (EVA) sheet, silicone encapsulants (for example, as described in U.S. Patent Application Publication No. 2011/0061724 A1, which is incorporated by reference into this specification), or curable liquid encapsulants such as, for example, thermosetting polyurethane, polyurea, or poly(urethane-urea) based coating compositions that can be deposited and cured to form solid encapsulant layers. Suitable curable liquid encapsulants are described, for example, in U.S. Patent Application Publication No. 2013/0240019 A1, which is incorporated by reference into this specification. For example, in one aspect, a backsheet can comprise a pre-cured polyurea sheet, and a first encapsulant layer can comprise a liquid encapsulant such as a thermosetting polyurethane coating composition. In another aspect, a liquid encapsulant can comprise a thermosetting polyurethane coating composition comprising a polyester polyol resin and a polyisocyanate crosslinker that cures under ambient conditions or at elevated temperatures to increase curing rate.

Figure 5A:
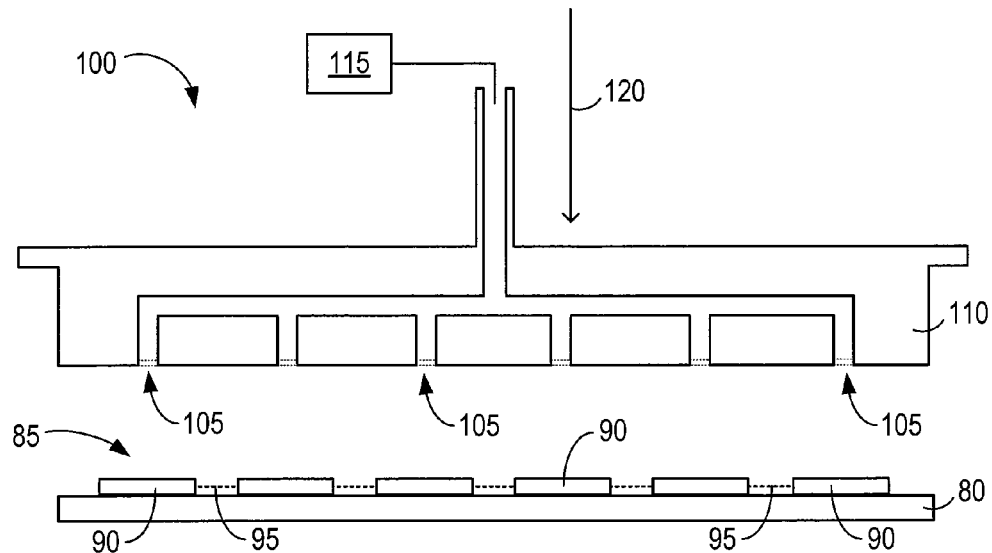
FIGS. 5A-5C are schematic diagrams in side cross-sectional view, not to scale, of a cell press system for suspending a photovoltaic cell matrix.
Figure 5B:
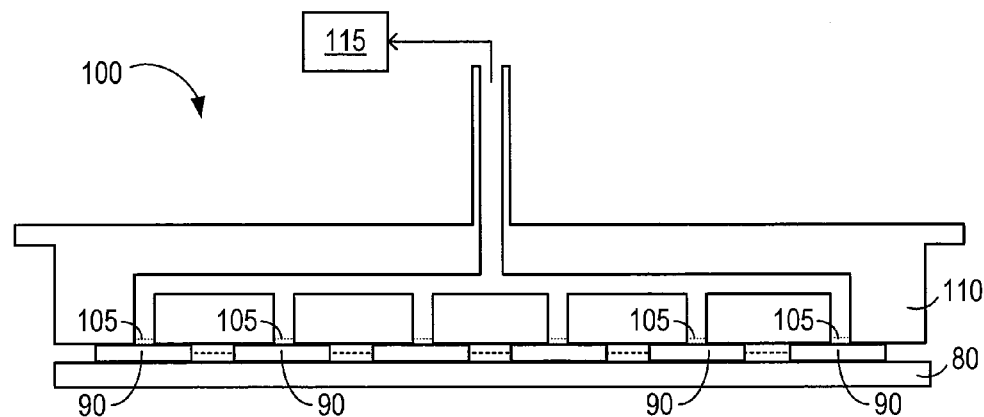
Figure 5C:
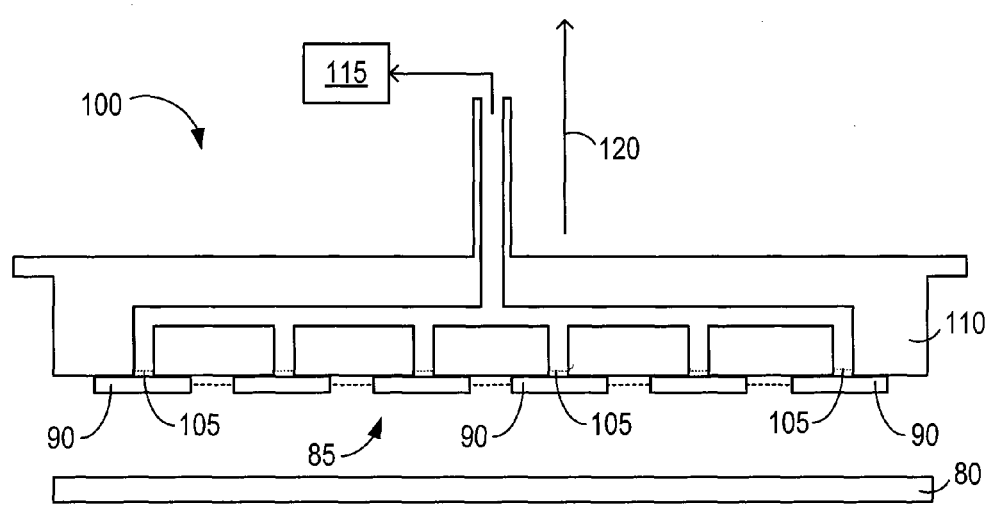

A photovoltaic module production process can comprise suspending a photovoltaic cell or a photovoltaic cell matrix comprising a plurality of electrically interconnected photovoltaic cells, wherein the front sides of the photovoltaic cells face upward when suspended. Referring to FIGS. 5A-5C, a photovoltaic cell matrix 85 can be suspended with a cell press system 100. The photovoltaic cell matrix 85 comprises photovoltaic cells 90 connected via electrical interconnections 95. The cell press system 100 comprises a vacuum system 115 operably connected to apertures 105 in a vertically-movable press plate 110. The press plate 110 can be vertically-movable along vertical axis 120, which allows the press plate 110 to be lowered toward and raised away from a conveyor 80. Suspending the photovoltaic matrix 85 can comprise lifting the photovoltaic cells 90 with the cell press 110, wherein the apertures 105 contact the front sides of the photovoltaic cells 90 and vacuum pressure applied through the apertures 105 secures the photovoltaic cells 90 to the press plate 110.

As shown in FIG. 5A, the photovoltaic cell matrix 85 can be located on the conveyor 80, which contacts the back sides of the photovoltaic cells 90 and supports the photovoltaic matrix 85 from underneath. The conveyor 80 can comprise a suitable mechanism for positioning and supporting the prior-assembled photovoltaic matrix 85 underneath the cell press system 100. The press plate 110 can be lowered along vertical axis 120 toward the photovoltaic matrix 85 and the conveyor 80. As shown in FIG. 5B, the downward vertical movement of the press plate 110 can be discontinued when the apertures 105 contact the upwardly-facing front sides of the photovoltaic cells 90, at which point vacuum pressure applied from the vacuum system 115 through the apertures 105 secures the photovoltaic cells 90 to the press plate 110. As shown in FIG. 5C, the press plate 110 can be raised along vertical axis 120 away from the conveyor 80 while maintaining the vacuum pressure applied from the vacuum system 115 through the apertures 105, thereby maintaining contact between the raising press plate 110 and the photovoltaic cells 90, thus lifting the photovoltaic cells 90 and suspending the photovoltaic cell matrix 85. The cell press system 100 can be operated robotically, hydraulically, pneumatically, or with any other suitable actuation mechanism to move the press plate 110 vertically downward and upward along vertical axis 120.

The cell press described in U.S. Pat. No. 8,420,412, which is incorporated by reference into this specification, can be used to suspend a photovoltaic cell matrix and perform other operations, described below, in accordance with various aspects of the process described in this specification.

A photovoltaic module production process can comprise positioning a backsheet and a first encapsulant layer underneath a suspended photovoltaic cell or photovoltaic cell matrix. The first encapsulant layer can be applied onto the backsheet, as described above, before positioning of the backsheet and the first encapsulant layer underneath the suspended photovoltaic cell or photovoltaic cell matrix. A photovoltaic module production process can also comprise lowering the suspended photovoltaic cell or photovoltaic cell matrix into contact with the first encapsulant layer, wherein the back sides of the photovoltaic cells contact the first encapsulant layer.

Figure 6A:
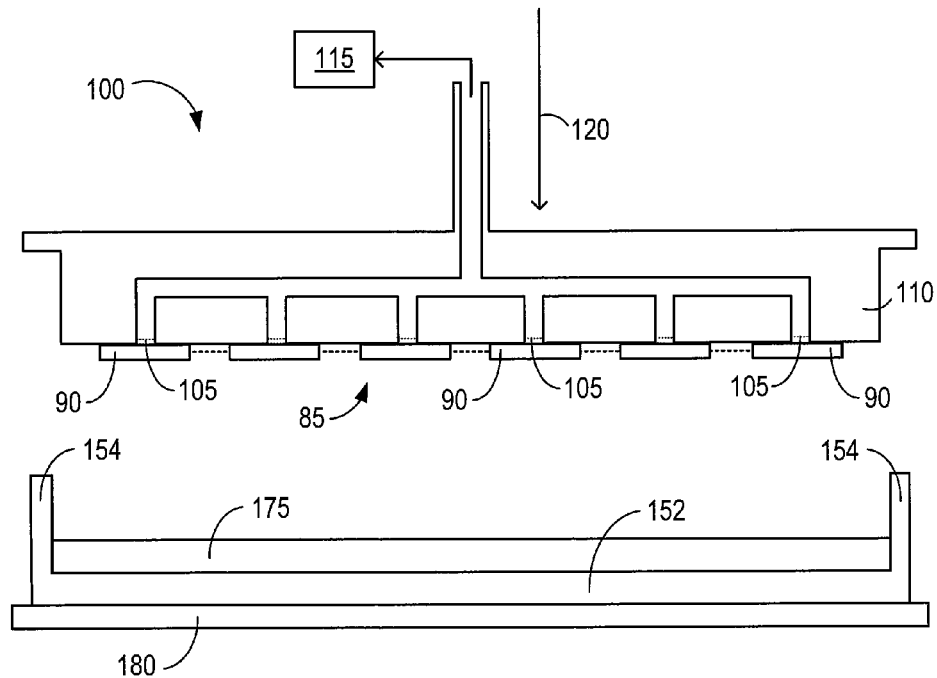
FIGS. 6A-6C are schematic diagrams in side cross-sectional view, not to scale, of a cell press system for positioning a photovoltaic cell matrix onto an encapsulant layer applied to a photovoltaic module backsheet.

Referring to FIG. 6A, a backsheet 152 and a first encapsulant layer 175 can be positioned underneath the suspended photovoltaic cell matrix 85 described above in connection with FIGS. 5A-5C. The backsheet 152 comprises a rim 154 around the perimeter of the backsheet 152. The rim 154 projects from and surrounds a front planar surface of the backsheet 152 and the first encapsulant layer 175. The rim 154 and the front planar surface together define a volume containing the first encapsulant layer 175. The volume defined by the rim 154 and the front planar surface can contain other components of a photovoltaic module positioned during downstream production steps, described below. The backsheet 152 and the first encapsulant layer 175 are located on a conveyor 180, which contacts the back side of the backsheet 152 and supports the backsheet 152 and the first encapsulant layer 175 from underneath. The conveyor 180 can comprise a suitable mechanism for positioning and supporting the backsheet 152 and the first encapsulant layer 175 underneath the cell press system 100.

Figure 6B:
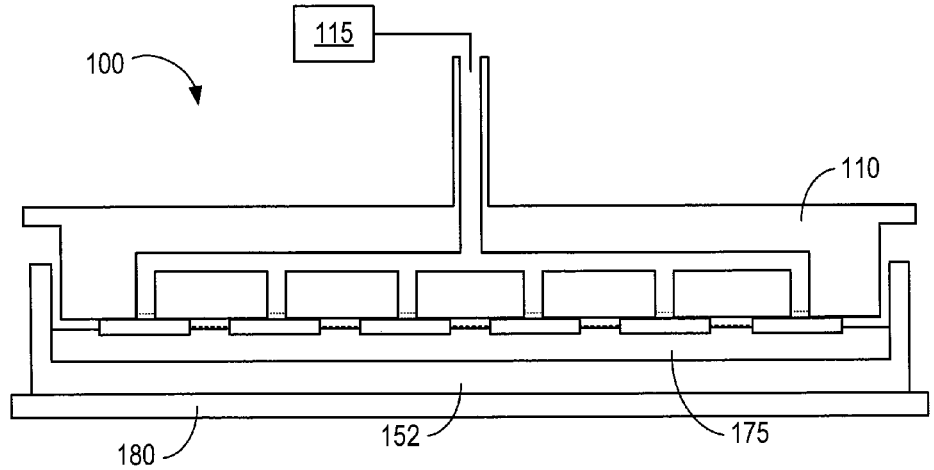
Figure 6C:
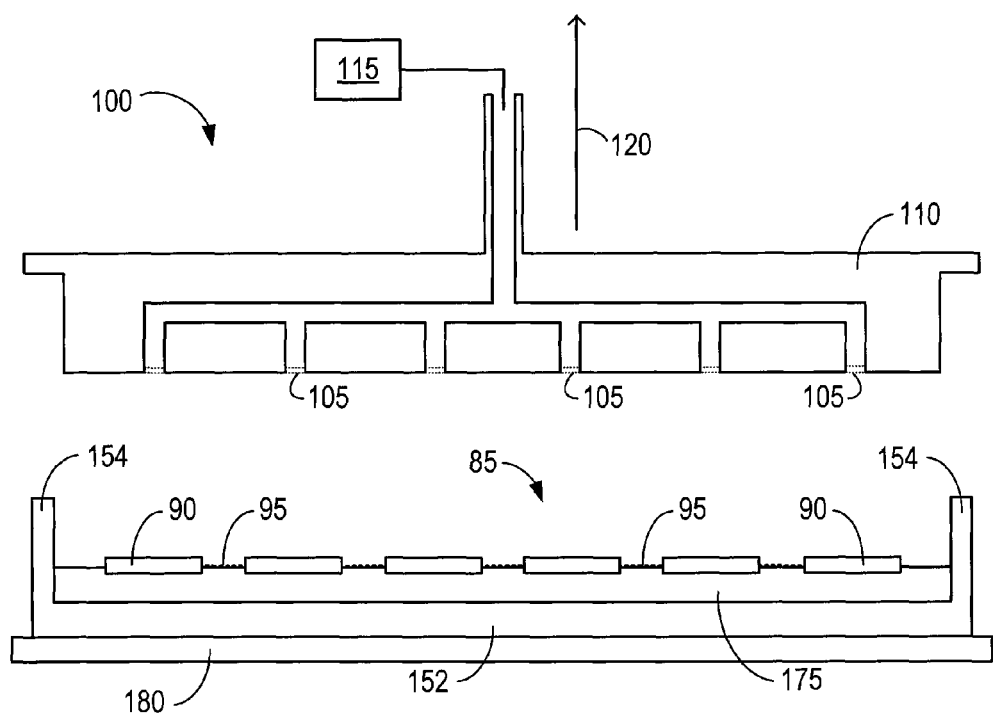

The press plate 110 with the suspended photovoltaic cell matrix 85 can be lowered along vertical axis 120 toward the first encapsulant layer 175 and the backsheet 152. As shown in FIG. 6B, the downward vertical movement of the press plate 110 can be discontinued when the back sides of the photovoltaic cells 90 contact the first encapsulant layer 175, at which point the vacuum pressure applied from the vacuum system 115 and through the apertures 105 can be discontinued, thereby releasing the photovoltaic cell matrix 85 from the press plate 110. As shown in FIG. 6C, the press plate 110 can be raised along vertical axis 120 away from the photovoltaic cell matrix 85, the first encapsulant layer 175, and the backsheet 152 after discontinuing the vacuum pressure applied from the vacuum system 115 through the apertures 105. As the press plate 110 lifts away from the photovoltaic cell matrix 85, the electrical interconnections 95 and/or the photovoltaic cells 90 remain in contact with the underlying first encapsulant layer 175. The back surfaces of the photovoltaic cells 90 contact the underlying first encapsulant layer 175, and the front surfaces of the photovoltaic cells 90 face outwardly away from the first encapsulant layer 175. As noted above, the cell press system 100 can be operated robotically, hydraulically, pneumatically, or with any other suitable actuation mechanism to move the press plate 110 vertically downward and upward along vertical axis 120. The rim portion 154 of the backsheet 152 can surround the first encapsulant layer 175 and the photovoltaic cell matrix 85.

A photovoltaic module production process can comprise introducing an inert gas (such as, for example, nitrogen, argon, or the like) between the suspended photovoltaic cell or photovoltaic cell matrix and the first encapsulant layer before lowering the suspended photovoltaic cell or photovoltaic cell matrix into contact with the first encapsulant layer. For example, a hermetically sealed chamber can be provided surrounding the suspended photovoltaic cell matrix, the backsheet, and the first encapsulant layer. The hermetically sealed chamber can be purged with an inert gas to create an inert gas atmosphere between the suspended photovoltaic cell or photovoltaic cell matrix and the first encapsulant layer. The inert gas atmosphere between the suspended photovoltaic cell or photovoltaic cell matrix and the first encapsulant layer can be maintained as the back sides of the photovoltaic cells contact the first encapsulant layer. If the first encapsulant layer comprises a liquid encapsulant, the inert gas atmosphere can reduce the incidence of bubble formation in the liquid encapsulant layer during the positioning of the photovoltaic cell or photovoltaic cell matrix, and any bubbles that form in the liquid encapsulant layer can be relatively small and free of trapped oxygen and moisture.

Figure 7:
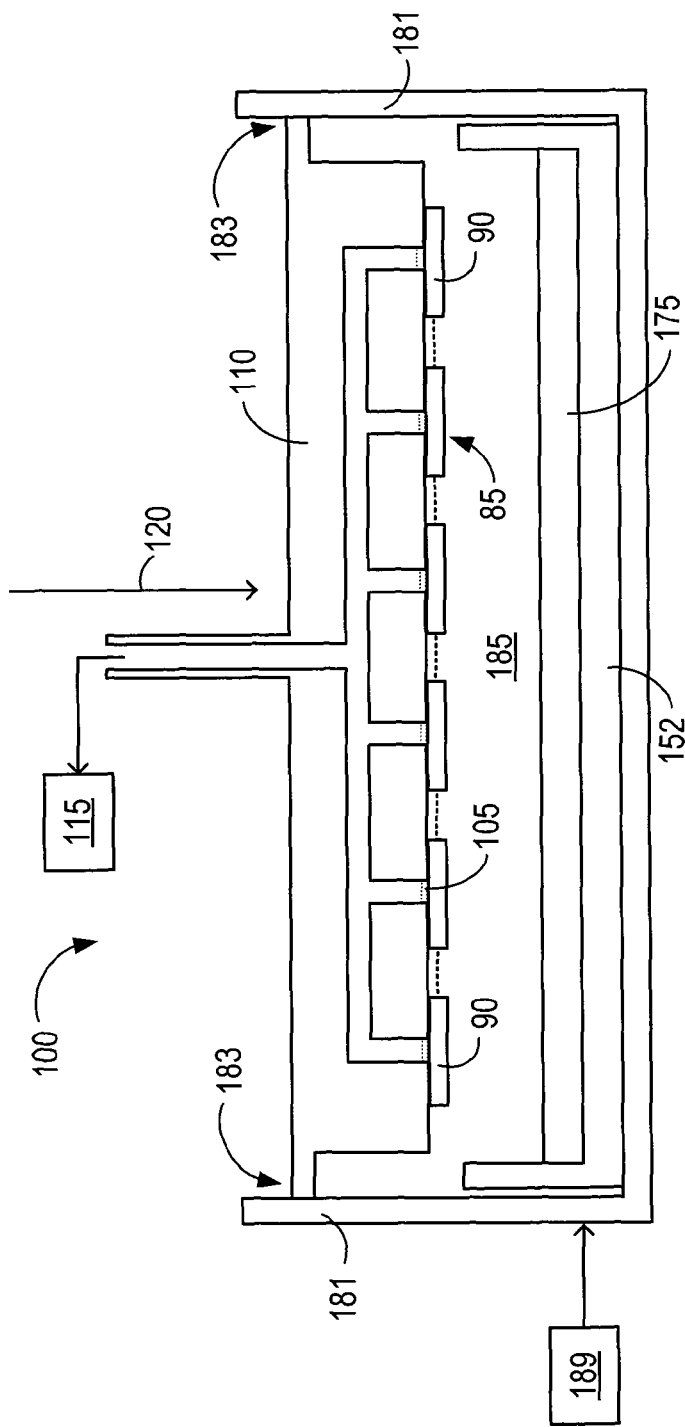
FIG. 7 is a schematic diagram in side cross-sectional view, not to scale, of a cell press system for positioning a photovoltaic cell matrix onto an encapsulant layer in an inert gas atmosphere.

Referring to FIG. 7, for example, a backsheet 152 and a first encapsulant layer 175 can be positioned underneath a suspended photovoltaic cell matrix 85. The backsheet 152, the first encapsulant layer 175, and the suspended photovoltaic cell matrix 85 can be positioned in a hermetically sealed chamber 185. The hermetically sealed chamber 185 can be formed between the press plate 110 and a chamber wall 181, which engage and hermetically seal at 183. The press plate 110 with the suspended photovoltaic cell matrix 85 can be lowered along vertical axis 120 within the hermetically sealed chamber 185 toward the first encapsulant layer 175 and the backsheet 152. The hermetically sealed chamber 185 can be purged with an inert gas from inert gas source 189. An inert gas atmosphere can be created in the hermetically sealed chamber 185 between the suspended photovoltaic cell matrix 85 and the first encapsulant layer 175, and maintained as the press plate 110 lowers and the back sides of the photovoltaic cells 90 contact the first encapsulant layer 175. The method and system shown in FIG. 7 can otherwise operate in the same or similar manner as described above in connection with FIGS. 6A-6C.

A photovoltaic module production process can comprise applying a second encapsulant layer over at least the front sides of photovoltaic cells positioned on a first encapsulant layer. For example, a second encapsulant layer can be applied over a photovoltaic cell matrix positioned on a first encapsulant layer and cover at least the front sides of the constituent photovoltaic cells and the electrical interconnections. The second encapsulant layer can contact the underlying first encapsulant layer in areas where no photovoltaic cells and electrical interconnections are present. The first and second encapsulant layers can, together, at least partially encapsulate the photovoltaic cells and electrical interconnections.

Figure 8:
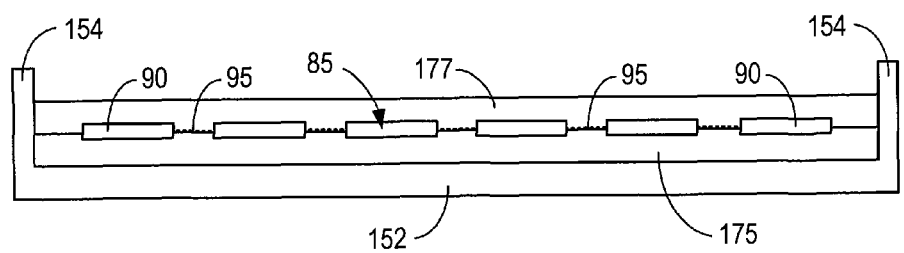
FIG. 8 is a schematic diagram in side cross-sectional view, not to scale, of a second encapsulant layer, a photovoltaic cell matrix, and a first encapsulant layer applied to a photovoltaic module backsheet comprising a perimeter rim surrounding the photovoltaic cell matrix and encapsulant layers.

Referring to FIG. 8, for example, a second encapsulant layer 177 can be applied over the photovoltaic cell matrix 85 positioned on the first encapsulant layer 175. The second encapsulant layer 177 can cover the front sides of the constituent photovoltaic cells 90 and the electrical interconnections 95. The second encapsulant layer 177 can contact the first encapsulant layer 175 in areas where no photovoltaic cells 90 and electrical interconnections 95 are present. The first encapsulant layer 175 and the second encapsulant layer 177 can together encapsulate the photovoltaic cells 90 and electrical interconnections 95. A conveyor (not shown) can be used to support, transport, and position the backsheet 152, the first encapsulant layer 175, and the photovoltaic cell matrix 85. For example, a suitable mechanism can support and transport the backsheet 152, the first encapsulant layer 175, and the photovoltaic cell matrix 85 from a cell press (for example, cell press system 100 in FIGS. 6A-6C and 7) to an encapsulant application apparatus such as, for example, a sheet positioning system or coating deposition system. The rim portion 154 of the backsheet 152 can surround the first encapsulant layer 175, the photovoltaic cell matrix 85, and the second encapsulant layer 177.

The second encapsulant layer can comprise a pre-formed solid sheet of encapsulant material that can be applied onto the underlying photovoltaic cell or photovoltaic cell matrix. Alternatively, the second encapsulant layer can comprise a liquid encapsulant material that can be applied onto the underlying photovoltaic cell or photovoltaic cell matrix as a deposited liquid coating layer that can be subsequently cured in a later curing step. The optional rim portion of a backsheet can contain a deposited liquid coating layer (within the volume formed by the front planar surface together with the rim) during subsequent production steps. Liquid encapsulant materials can be applied onto the underlying photovoltaic cell or photovoltaic cell matrix using a coating deposition operation such as, for example, spray coating, dip coating, roll coating, brush coating, roller coating, curtain coating, flow coating, cylindrical hole coating, and slot die coating.

In another aspect, the second encapsulant layer can comprise a powder coating composition applied onto the underlying photovoltaic cell or photovoltaic cell matrix as a deposited powder coating layer than can be subsequently cured in a later curing step. The optional rim portion of a backsheet can contain a deposited powder coating layer (within the volume formed by the front planar surface together with the rim) during subsequent production steps. Powder coatings can be applied onto the underlying photovoltaic cell or photovoltaic cell matrix using electrostatic deposition or other suitable powder coating deposition techniques.

The second encapsulant layer can comprise, for example, a pre-formed solid ethylene vinyl acetate (EVA) sheet, silicone encapsulants (for example, as described in U.S. Patent Application Publication No. 2011/0061724 A1, which is incorporated by reference into this specification), or curable liquid encapsulants such as, for example, thermosetting polyurethane, polyurea, or poly(urethane-urea) based coating compositions that can be deposited and cured to form solid encapsulant layers. Suitable curable liquid encapsulants are described, for example, in U.S. Patent Application Publication No. 2013/0240019 A1, which is incorporated by reference into this specification. In one aspect, for example, a liquid encapsulant can comprise a thermosetting polyurethane coating composition comprising a polyester polyol resin and a polyisocyanate crosslinker that cures under ambient conditions or at elevated temperatures to increase curing rate.

The first and second encapsulant layers can independently comprise the same or different encapsulant materials. For example, in one aspect, a first encapsulant layer can comprise a liquid encapsulant such as a thermosetting polyurethane coating composition, and a second encapsulant layer can comprise the same thermosetting polyurethane coating composition or a different liquid encapsulant material, provided that the second encapsulant layer comprises an encapsulant material that cures to form a solid encapsulant layer sufficiently clear to permit incident light to pass through into the underlying photovoltaic cells with negligible attenuation or otherwise sufficient for the photovoltaic generation of electrical charge carriers. A second encapsulant layer can thus comprise a clear liquid encapsulant layer, a clear powder coating layer, or a clear pre-formed solid sheet of encapsulant material such as EVA. For example, in another aspect, the first and second encapsulant layers can comprise EVA sheets. Alternatively, the first and second encapsulant layers can comprise clear liquid encapsulant layers.

A photovoltaic module production process can comprise positioning a front transparency onto a second encapsulant layer. The front transparency can comprise, for example, a glass sheet (e.g., silicate glasses) or a pre-formed transparent polymer sheet (e.g., a polyimide sheet or a polycarbonate sheet). The front transparency can be sufficiently transparent to permit incident light to pass through into underlying photovoltaic cells with negligible attenuation or otherwise sufficient for the photovoltaic generation of electrical charge carriers.

In one aspect, for example, positioning a front transparency onto the second encapsulant layer can comprise lifting the front transparency with a press comprising a vacuum system operably connected to apertures in a vertically-movable press plate, wherein the apertures contact a front side of the front transparency and vacuum pressure applied through the apertures secures the front transparency to the press plate. A backsheet can be positioned underneath the suspended front transparency, wherein the backsheet comprises overlying first and second encapsulant layers and a photovoltaic cell or photovoltaic cell matrix positioned on the backsheet and between the first encapsulant layer and the second encapsulant layer. A vacuum can be applied between the suspended front transparency and the second encapsulant layer. The press plate can be lowered until a back side of the front transparency contacts the second encapsulant layer. The vacuum can be maintained as the front transparency contacts the second encapsulant layer. The applied vacuum pressure from the apertures can be discontinued after the front transparency contacts the second encapsulant layer, thereby releasing the front transparency from the press plate. The press plate can be raised away from the front transparency.

Figure 9A:
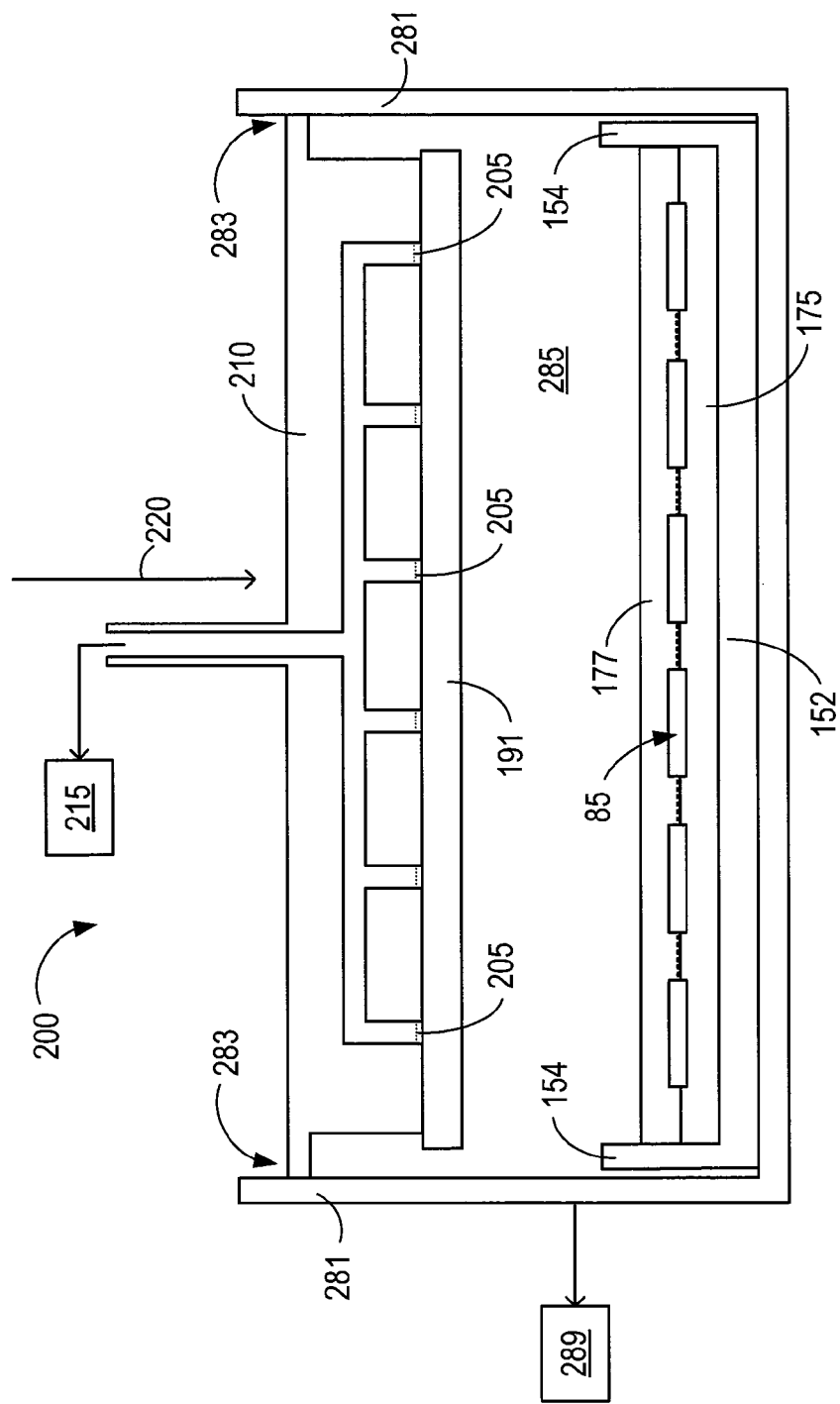
FIGS. 9A-9C are schematic diagrams in side cross-sectional view, not to scale, of a press system for positioning a front transparency onto an encapsulant layer to form a photovoltaic module preassembly.

Referring to FIG. 9A, a front transparency 191 can be lifted and suspended with a press system 200. The press system 200 comprises a vacuum system 215 operably connected to apertures 205 in a vertically-movable press plate 210. The press plate 210 can be vertically-movable along vertical axis 220, which allows the press plate 210 to be vertically lowered and raised. Suspending the front transparency 191 can comprise lifting the front transparency 191 with the press plate 210, wherein the apertures 205 contact the front side of the front transparency 191 and vacuum pressure applied from a vacuum system 215 through the apertures 205 secures the front transparency 191 to the press plate 210.

A backsheet 152 comprising a first encapsulant layer 175, a photovoltaic cell matrix 85, and a second encapsulant layer 177 can be positioned underneath the suspended front transparency 191. The backsheet 152, the first encapsulant layer 175, the photovoltaic cell matrix 85, the second encapsulant layer 177, and the suspended front transparency 191 can be contained a hermetically sealed chamber 285. The hermetically sealed chamber 285 can be formed between the press plate 210 and a chamber wall 281, which engage and hermetically seal at 283. The press plate 210 with the suspended front transparency 191 can be lowered along vertical axis 220 within the hermetically sealed chamber 285 toward the second encapsulant layer 177. A vacuum can be applied in the hermetically sealed chamber 285 by applying vacuum pressure from vacuum system 289. A vacuum can be created in the hermetically sealed chamber 285 between the suspended front transparency 191 and the second encapsulant layer 177, and the vacuum can be maintained as the press plate 210 lowers and the back side of the front transparency 191 contacts the second encapsulant layer 177.

Figure 9B:
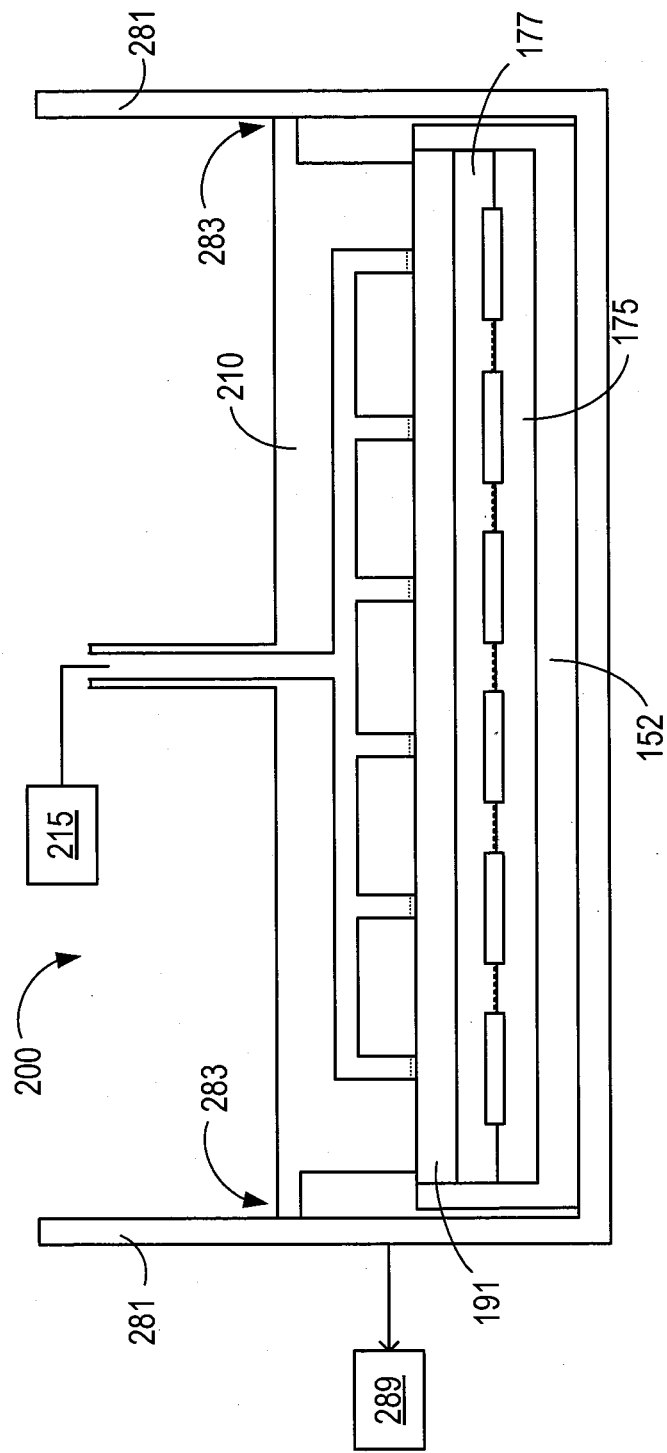
Figure 9C:
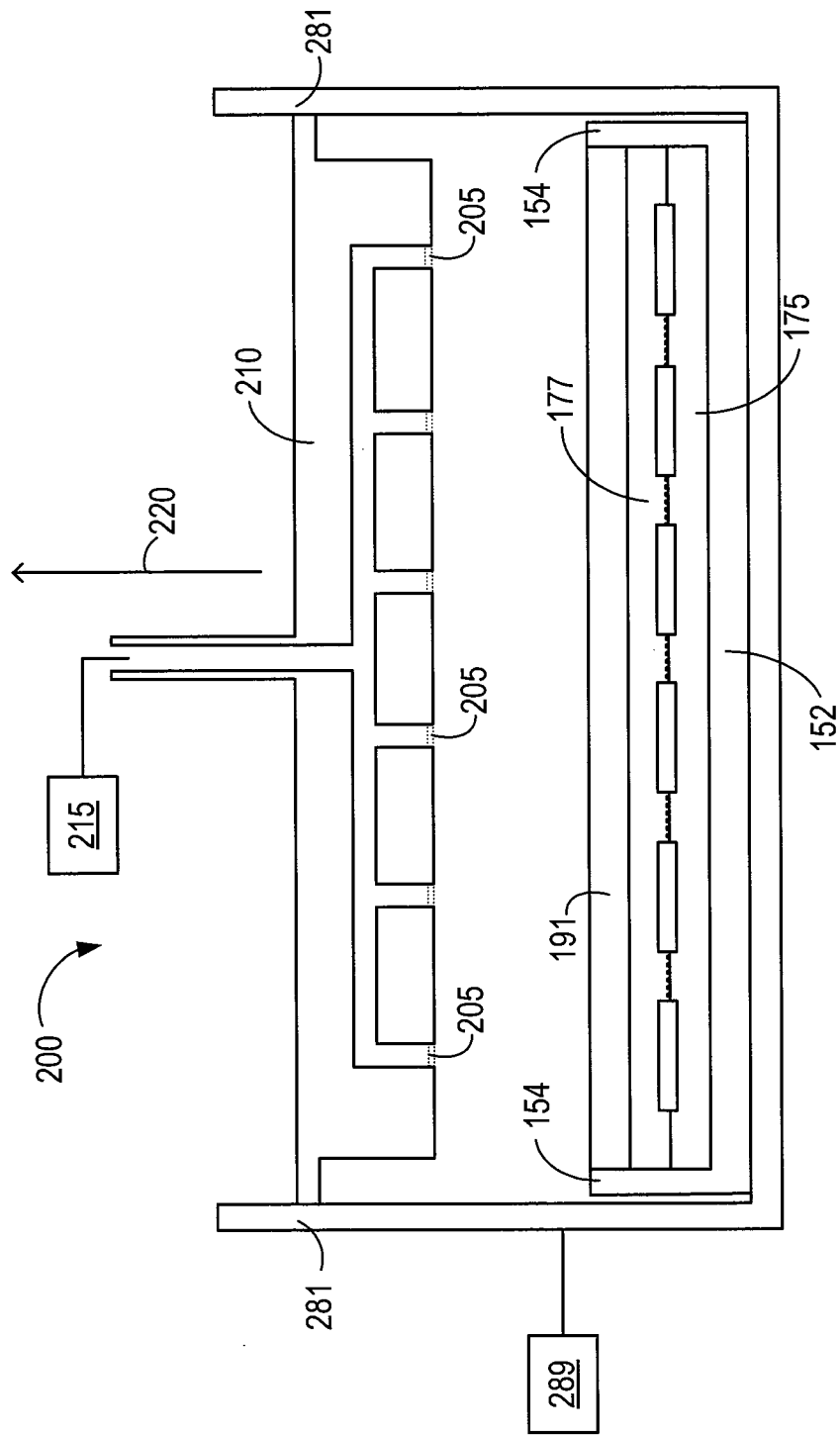

As shown in FIG. 9B, the downward vertical movement of the press plate 210 can be discontinued when the back side of the front transparency 191 contacts the second encapsulant layer 177, at which point the vacuum pressure applied from the vacuum system 215 through the apertures 105 can be discontinued, thereby releasing the front transparency 191 from the press plate 210. As shown in FIG. 9C, the press plate 210 can be raised along vertical axis 220 away from the front transparency 191 after discontinuing the vacuum pressure applied from the vacuum system 215 through the apertures 205. The vacuum pressure applied from the vacuum system 289 can also be discontinued after the front transparency 191 contacts the second encapsulant layer 177. As the press plate 210 lifts away from the front transparency 191, the front transparency 191 remains in contact with the underlying second encapsulant layer 177. The press system 200 can be operated robotically, hydraulically, pneumatically, or with any other suitable actuation mechanism to move the press plate 210 vertically downward and upward along vertical axis 220. The rim portion 154 of the backsheet 152 can surround the first encapsulant layer 175, the photovoltaic cell matrix 85, the second encapsulant layer 177, and the front transparency 191. The press system described in U.S. Pat. No. 8,420,412, which is incorporated by reference into this specification, can be used to suspend and position a front transparency in accordance with various aspects of the process described in this specification.

In another aspect, for example, positioning the front transparency onto the second encapsulant layer can comprise lifting the front transparency with a robotic system. A first end of the front transparency can be placed in contact with the second encapsulant layer adjacent to a first end of the backsheet, wherein the front transparency can be positioned at an angle relative to the second encapsulant layer. The front transparency can be tilted to reduce the angle between the front transparency and the second encapsulant layer until a second opposite end of the front transparency contacts the second encapsulant layer adjacent to a second opposite end of the backsheet and there can be a zero angle between the front transparency and the second encapsulant layer (i.e., until the front transparency is parallel to the second encapsulant layer). A vacuum can be applied between the front transparency and the second encapsulant layers, and the vacuum can be maintained as the front transparency is tilted into contact with the second encapsulant layer.

As used herein, the term "adjacent" describes the relative positioning of components comprising a photovoltaic module, wherein the subject components can be either in direct physical contact or indirectly positioned beside each other with an intervening component or space. Accordingly, and by way of example, where a first component is said to be positioned adjacent to a second component, it is understood that the first component can be, but is not necessarily, in direct physical contact with the second component.

Figure 10A:
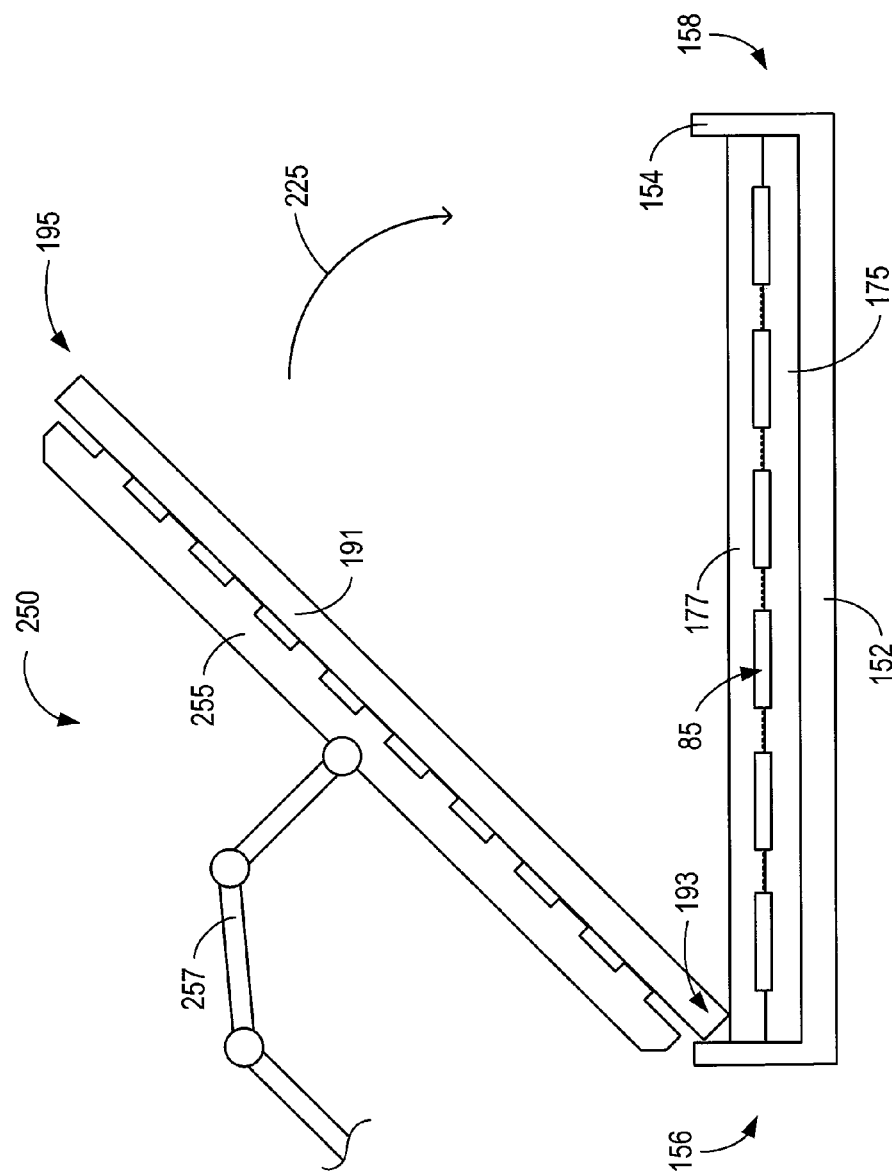
FIGS. 10A and 10B are schematic diagrams in side cross-sectional view, not to scale, of a robotic system for positioning a front transparency onto an encapsulant layer to form a photovoltaic module preassembly.
Figure 10B:
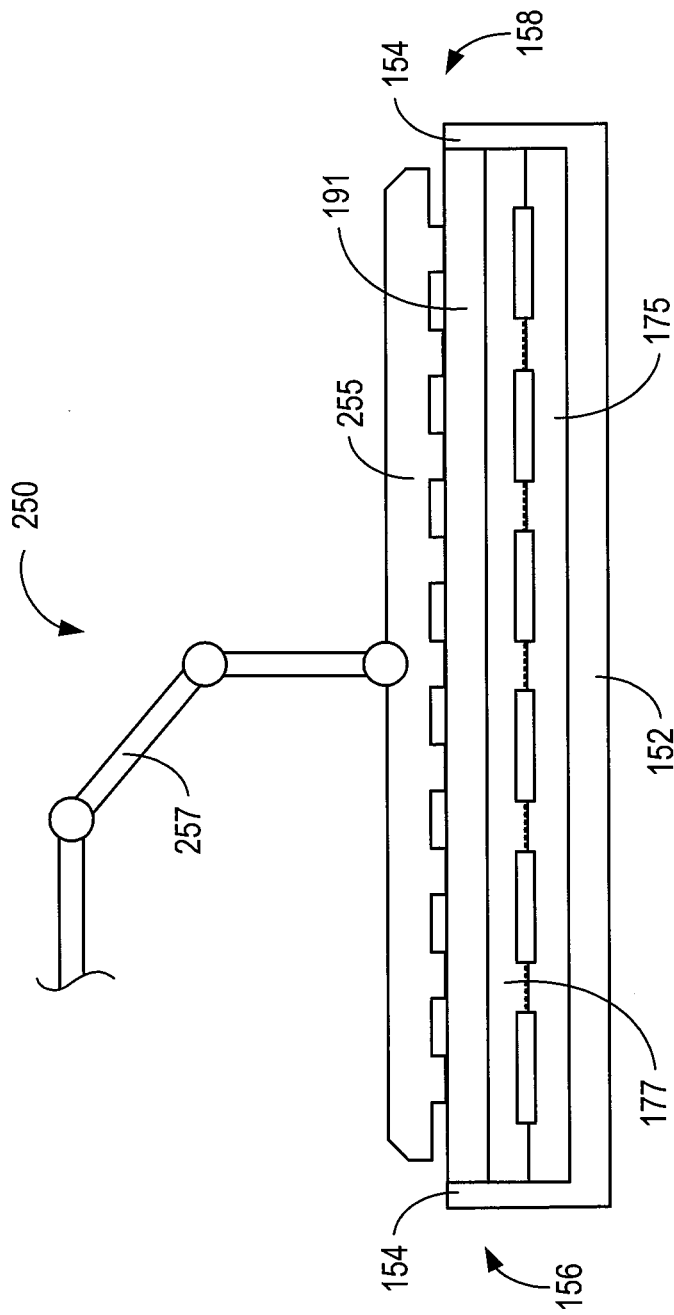

Referring to FIGS. 10A and 10B, a robotic system 250 comprises a robotic arm 257 coupled to a transport platform 255. The robotic system 250 lifts a front transparency 191 by securing the front transparency to the transport platform 255 and moving the transport platform 255 with the robotic arm 257. The front transparency 191 can be secured to the transport platform 255 of the robotic system 250 using any suitable mechanism, such as, for example, vacuum pressure applied through apertures (not shown) in the transport platform contacting the front surface of the front transparency 191.

A first end 193 of the front transparency 191 can be placed in contact with the second encapsulant layer 177 adjacent to a first end 156 of the backsheet 152, wherein the front transparency 191 can be positioned at an angle relative to the second encapsulant layer 177, as shown in FIG. 10A. The front transparency 191 can be downwardly tilted by the robotic system in the direction indicated by arrow 225 in FIG. 10A to reduce the angle between the front transparency 191 and the second encapsulant layer 177. The front transparency 191 can be tilted until a second opposite end 195 of the front transparency 191 contacts the second encapsulant layer 177 adjacent to a second opposite end 158 of the backsheet 152 and there can be a zero angle between the front transparency 191 and the second encapsulant layer 177, as shown in FIG. 10B. When the front transparency 191 is positioned by the robotic system 250 so that there can be a zero angle relative to the second encapsulant layer 177, the back side surface of the front transparency 191 can contact the upwardly facing surface of the second encapsulant layer 177, as shown in FIG. 10B. An optional vacuum (vacuum system not shown) can be applied between the front transparency 191 and the second encapsulant layer 177, and the vacuum can be maintained as the robotic system tilts and positions the front transparency 191 into contact with the second encapsulant layer 177. In the absence of an optional vacuum, the motion of the front transparency 191 as it tilts toward the second encapsulant layer 177 can push any air out from between the front transparency 191 and the second encapsulant layer 177, thereby reducing or minimizing any air trapped between the back side surface of the front transparency 191 and the upwardly facing surface of the second encapsulant layer 177 when the surfaces come into contact.

A photovoltaic module production process can comprise curing the first encapsulant layer and curing the second encapsulant layer. For example, curing the first and second encapsulant layers can comprise simultaneously curing both layers after positioning the front transparency into contact with the second encapsulant layer. Alternatively, curing the first and second encapsulant layers can comprise sequentially curing the layers, wherein the first encapsulant layer can be cured after the positioning of a photovoltaic cell or photovoltaic cell matrix and before the application of a second encapsulant layer, and the second encapsulant layer can be cured after positioning a front transparency into contact with the second encapsulant layer. In some aspects, for example, if the first encapsulant layer comprises a curable liquid encapsulant such as a thermosetting polyurethane, polyurea, or poly(urethane-urea) based composition, the first encapsulant layer can be partially cured before positioning a photovoltaic cell or photovoltaic cell matrix in contact with the first encapsulant layer. The first encapsulant layer can be partially cured to increase the viscosity of the curable liquid encapsulant (into a gel-like state, for example) before positioning a photovoltaic cell or photovoltaic cell matrix in contact with the first encapsulant layer. For instance, the first encapsulant layer 175 shown in FIG. 6A can be partially cured before contacting the photovoltaic cell matrix 85, and thereafter cured to a solid state either before or after application of the second encapsulant layer 177.

As used herein, the terms "cure" and "curing" refer to the solidification and/or bonding of the first and second encapsulant layers. The curing of encapsulant layers will depend on the chemical nature of the encapsulant materials (e.g., thermoplastic, thermosetting, moisture curable, radiation curable, thermal curable, ambient curable, and the like). For example, curing solid EVA encapsulant layers can comprise heating the layers to elevated temperatures at which the two separately applied layers bond together into a single encapsulant layer that encapsulates an embedded photovoltaic cell or photovoltaic cell matrix, and adheres to and bonds together the front transparency and the backsheet.

Thermosetting liquid encapsulants, for example, can be cured by facilitating the chemical crosslinking of components in the encapsulant compositions, thereby solidifying the liquid encapsulant layers into solid encapsulant layers. For example, curing liquid encapsulant layers, such as thermosetting polyurethane encapsulant layers, can comprise heating or otherwise facilitating the crosslinking of a resin component with an intermixed crosslinker component. During the crosslinking reactions, the first and second encapsulant layers can at least partially coalesce or otherwise bond together into a single encapsulant layer that encapsulates an embedded photovoltaic cell or photovoltaic cell matrix, and adheres to and bonds together the front transparency and the backsheet.

Figure 11A:
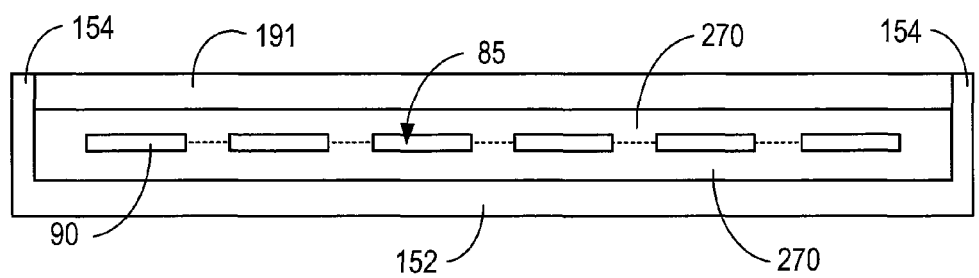
FIGS. 11A-11C are schematic diagrams in side cross-sectional view, not to scale, of photovoltaic modules produced in accordance with the processes and systems described in this specification.
Figure 11B:
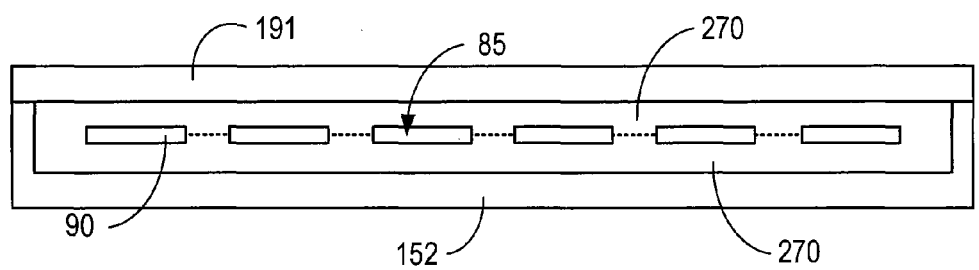
Figure 11C:
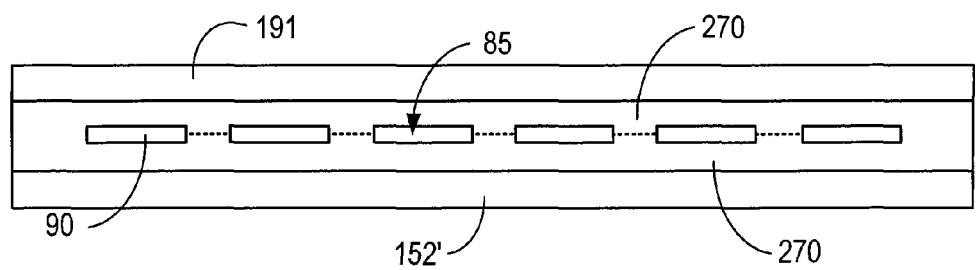

Referring to FIGS. 11A-11C, cured encapsulant layer 270 can be formed by curing first and second encapsulant layers (see, for example, the first and second encapsulant layers 175 and 177 in FIGS. 9C and 10B). The cured encapsulant layer 270 adheres to and bonds together the front transparency 191 and the backsheet 152. The cured encapsulant layer 270 can encapsulate an embedded photovoltaic cell 90 and/or a photovoltaic cell matrix 85.

Although certain aspects are described in this specification in which a backsheet comprises a perimeter rim portion that can surround encapsulant material, a photovoltaic cell or photovoltaic cell matrix, and a front transparency, the processes and systems described in this specification can employ backsheets that have perimeter rim portions that can surround a subset of photovoltaic module components such as encapsulant material and a photovoltaic cell or photovoltaic cell matrix, but not a front transparency (see FIG. 11B). The processes and systems described in this specification can employ backsheets that do not have a perimeter rim portion (see FIG. 11C).

In an industrial implementation of the processes and systems described in this specification, separate unit operations can include, for example: (1) the application of a first encapsulant layer onto a backsheet; (2) the lifting/suspending of a photovoltaic cell or photovoltaic cell matrix; (3) the positioning of a backsheet and first encapsulant layer underneath suspended photovoltaic cells; (4) the lowering and positioning of the photovoltaic cell or photovoltaic cell matrix onto the first encapsulant layer; (5) the application of a second encapsulant layer onto front sides of the photovoltaic cells and electrical interconnections; (6) the positioning of a front transparency onto the second encapsulant layer; and (7) the curing of the encapsulant materials. The various components and in-progress module preassemblies can be transported between unit operations using suitable transport mechanisms. For example, backsheets, photovoltaic cells and photovoltaic cell matrices, front transparencies, and in-progress module preassemblies can be transported on conveyor belts, shuttle plates, support platforms, and the like.

After the production of a photovoltaic module comprising at least one or a plurality of electrically interconnected photovoltaic cells encapsulated in encapsulant material between a front transparency and a backsheet, the module can be framed to provide for installation and further protection from damage due to environmental exposure or other impacts. A junction box can be provided to a framed photovoltaic module to enable electrical connections among multiple modules and/or to other electrical systems such as the power grid or a local power distribution system in a building, campus, or other location.

Accordingly, this specification provides various aspects of a process for producing a photovoltaic module. For example, in a first aspect, Aspect 1, this specification describes a process for producing a photovoltaic module comprising: suspending a photovoltaic cell matrix comprising a plurality of electrically interconnected photovoltaic cells, wherein front sides of the photovoltaic cells face upward when suspended; positioning a backsheet and a first encapsulant layer underneath the suspended photovoltaic cell matrix; lowering the suspended photovoltaic cell matrix into contact with the first encapsulant layer, wherein back sides of the photovoltaic cells contact the first encapsulant layer; applying a second encapsulant layer over at least the front sides of the photovoltaic cells and the electrical interconnections; positioning a front transparency onto the second encapsulant layer; and curing the first encapsulant layer and the second encapsulant layer.

In another aspect, Aspect 2, this specification describes a process for producing a photovoltaic module as described in Aspect 1, further comprising applying the first encapsulant layer onto the backsheet, wherein the backsheet comprises a rim around a perimeter of the backsheet, the rim surrounding the first encapsulant layer.

In another aspect, Aspect 3, this specification describes a process for producing a photovoltaic module as described in Aspect 2, wherein the backsheet comprises a pre-formed polymer sheet, and the first encapsulant layer comprises a liquid encapsulant.

In another aspect, Aspect 4, this specification describes a process for producing a photovoltaic module as described in any of Aspects 1-3, wherein suspending the photovoltaic cell matrix comprises lifting the photovoltaic cells with a cell press comprising a vacuum system operably connected to apertures in a vertically-movable press plate, wherein the apertures contact the front sides of the photovoltaic cells and vacuum pressure applied through the apertures secures the photovoltaic cells to the press plate.

In another aspect, Aspect 5, this specification describes a process for producing a photovoltaic module as described in Aspect 4, further comprising lowering the press plate until the back sides of the photovoltaic cells contact the first encapsulant layer; discontinuing the applied vacuum pressure from the apertures, thereby releasing the photovoltaic cell matrix from the press plate; and raising the press plate away from the photovoltaic cell matrix.

In another aspect, Aspect 6, this specification describes a process for producing a photovoltaic module as described in any of Aspects 1-5, further comprising introducing inert gas between the suspended photovoltaic cell matrix and the first encapsulant layer.

In another aspect, Aspect 7, this specification describes a process for producing a photovoltaic module as described in Aspect 6, further comprising providing a hermetically sealed chamber surrounding the suspended photovoltaic cell matrix, the backsheet, and the first encapsulant layer, wherein introducing the inert gas comprises purging the hermetically sealed chamber with the inert gas to create an inert gas atmosphere between the suspended photovoltaic cell matrix and the first encapsulant layer.

In another aspect, Aspect 8, this specification describes a process for producing a photovoltaic module as described in any of Aspects 1-7, wherein applying the second encapsulant layer over at least the front sides of the photovoltaic cells and the electrical interconnections comprises applying a clear liquid encapsulant layer over the photovoltaic cell matrix and the first encapsulant layer.

In another aspect, Aspect 9, this specification describes a process for producing a photovoltaic module as described in any of Aspects 1-8, wherein the backsheet comprises a rim around a perimeter of the backsheet, the rim surrounding the first encapsulant layer, the photovoltaic cell matrix, the second encapsulant layer, and the front transparency.

In another aspect, Aspect 10, this specification describes a process for producing a photovoltaic module as described in any of Aspects 1-9, wherein positioning the front transparency onto the second encapsulant layer comprises: lifting the front transparency with a press comprising a vacuum system operably connected to apertures in a vertically-movable press plate, wherein the apertures contact a front side of the front transparency and vacuum pressure applied through the apertures secures the front transparency to the press plate; positioning the backsheet underneath the suspended front transparency, wherein the photovoltaic cell matrix is positioned on the backsheet and between the first encapsulant layer and the second encapsulant layer; applying a vacuum between the suspended front transparency and the second encapsulant layer; lowering the press plate until a back side of the front transparency contacts the second encapsulant layer; maintaining the vacuum as the front transparency contacts the second encapsulant layer; discontinuing the applied vacuum pressure from the apertures after the front transparency contacts the second encapsulant layer, thereby releasing the front transparency from the press plate; and raising the press plate away from the front transparency.

In another aspect, Aspect 11, this specification describes a process for producing a photovoltaic module as described in any of Aspects 1-10, wherein positioning the front transparency onto the second encapsulant layer comprises: lifting the front transparency with a robotic system; placing a first end of the front transparency in contact with the second encapsulant layer adjacent to a first end of the backsheet, wherein the front transparency is positioned at an angle relative to the second encapsulant layer; tilting the front transparency to reduce the angle between the front transparency and the second encapsulant layer until a second opposite end of the front transparency contacts the second encapsulant layer adjacent to a second opposite end of the backsheet and there is a zero angle between the front transparency and the second encapsulant layer.

In another aspect, Aspect 12, this specification describes a process for producing a photovoltaic module as described in Aspect 11, further comprising applying a vacuum between the front transparency and the second encapsulant layer, and maintaining the vacuum as the front transparency is tilted into contact with the second encapsulant layer.

In another aspect, Aspect 13, this specification describes a process for producing a photovoltaic module as described in any of Aspects 1-12, wherein curing the first encapsulant layer and the second encapsulant layer comprises simultaneously curing both layers after positioning the front transparency.

In another aspect, Aspect 14, this specification describes a process for producing a photovoltaic module comprising: suspending a photovoltaic cell with a front side of the photovoltaic cell facing upward; positioning a backsheet and a first encapsulant layer underneath the suspended photovoltaic cell; lowering the suspended photovoltaic cell into contact with the first encapsulant layer in the inert gas atmosphere, wherein a back side of the photovoltaic cell contacts the first encapsulant layer; applying a second encapsulant layer over at least the front side of the photovoltaic cell; positioning a front transparency onto the second encapsulant layer; and curing the first encapsulant layer and the second encapsulant layer.

In another aspect, Aspect 15, this specification describes a process for producing a photovoltaic module as described in Aspect 14, wherein suspending the photovoltaic cell comprises lifting the photovoltaic cell with a cell press comprising a vacuum system operably connected to an aperture in a vertically-movable press plate, wherein the aperture contacts the front side of the photovoltaic cell and vacuum pressure applied through the aperture secures the photovoltaic cell to the press plate.

In another aspect, Aspect 16, this specification describes a process for producing a photovoltaic module as described in Aspect 15, further comprising lowering the press plate until the back side of the photovoltaic cell contacts the first encapsulant layer; discontinuing the applied vacuum pressure from the aperture, thereby releasing the photovoltaic cell from the press plate; and raising the press plate away from the photovoltaic cell.

In another aspect, Aspect 17, this specification describes a process for producing a photovoltaic module as described in any of Aspects 14-16, wherein positioning the front transparency onto the second encapsulant layer comprises: lifting the front transparency with a press comprising a vacuum system operably connected to apertures in a vertically-movable press plate, wherein the apertures contact a front side of the front transparency and vacuum pressure applied through the apertures secures the front transparency to the press plate; positioning the backsheet underneath the suspended front transparency, wherein the photovoltaic cell matrix is positioned on the backsheet and between the first encapsulant layer and the second encapsulant layer; applying a vacuum between the suspended front transparency and the second encapsulant layer; lowering the press plate until a back side of the front transparency contacts the second encapsulant layer; maintaining the vacuum as the front transparency contacts the second encapsulant layer; discontinuing the applied vacuum pressure from the apertures after the front transparency contacts the second encapsulant layer, thereby releasing the front transparency from the press plate; and raising the press plate away from the front transparency.

In another aspect, Aspect 18, this specification describes a process for producing a photovoltaic module as described in any of Aspects 14-17, wherein positioning the front transparency onto the second encapsulant layer comprises: lifting the front transparency with a robotic system; placing a first end of the front transparency in contact with the second encapsulant layer adjacent to a first end of the backsheet, wherein the front transparency is positioned at an angle relative to the second encapsulant layer; tilting the front transparency to reduce the angle between the front transparency and the second encapsulant layer until a second opposite end of the front transparency contacts the second encapsulant layer adjacent to a second opposite end of the backsheet and there is a zero angle between the front transparency and the second encapsulant layer.

In another aspect, Aspect 19, this specification describes a process for producing a photovoltaic module as described in any of Aspects 14-18, wherein curing the first encapsulant layer and the second encapsulant layer comprises simultaneously curing both layers after positioning the front transparency.

In another aspect, Aspect 20, this specification describes a process for producing a photovoltaic module as described in any of Aspects 14-19, further comprising introducing inert gas between the suspended photovoltaic cell and the first encapsulant layer in a hermetically sealed chamber to create an inert gas atmosphere.

Various aspects have been described and illustrated in this specification to provide an overall understanding of the function, operation, and implementation of the disclosed processes, systems, and photovoltaic modules. It is understood that the various aspects described and/or illustrated in this specification can be combined with various other aspects. Such modifications and variations are intended to be included within the scope of this specification. As such, the claims can be amended to recite, in any combination, any aspects expressly or inherently described in, or otherwise expressly or inherently supported by, this specification. Further, Applicant reserves the right to amend the claims to affirmatively disclaim aspects that may be present in the prior art, even if those aspects are not expressly described in this specification. Therefore, any such amendments comply with written description and sufficiency requirements. The methods, systems, and devices disclosed and described in this specification can comprise, consist of, or consist essentially of the various aspects described herein.

Also, any numerical range recited in this specification is intended to include all sub-ranges of the same numerical precision subsumed within the recited range. For example, a range of "1.0 to 10.0" is intended to include all sub-ranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Accordingly, Applicant reserves the right to amend this specification, including the claims, to expressly recite any sub-range of the same numerical precision subsumed within the ranges expressly recited herein. All such ranges are intended to be inherently described in this specification such that amending to expressly recite any such sub-ranges would comply with written description and sufficiency requirements. Additionally, numerical parameters described in this specification should be construed in light of the number of reported significant digits and by applying ordinary rounding techniques. It is also understood that numerical parameters described in this specification will necessarily possess the inherent variability characteristic of the underlying measurement techniques used to determine the numerical value of the parameter.

Any patent, publication, or other disclosure material identified herein is incorporated by reference into this specification in its entirety unless otherwise indicated, but only to the extent that the incorporated material does not conflict with existing descriptions, definitions, statements, or other disclosure material expressly set forth in this specification. As such, and to the extent necessary, the express disclosure as set forth in this specification supersedes any conflicting material incorporated by reference. Any material, or portion thereof, that is said to be incorporated by reference into this specification, but which conflicts with existing definitions, statements, or other disclosure material set forth herein, is only incorporated to the extent that no conflict arises between that incorporated material and the existing disclosure material. Applicants reserve the right to amend this specification to expressly recite any subject matter, or portion thereof, incorporated by reference herein.

The grammatical articles "one", "an", and "the", as used in this specification, are intended to include "at least one" or "one or more", unless otherwise indicated. Thus, the articles are used in this specification to refer to one or more than one (i.e., to "at least one") of the grammatical objects of the article. By way of example, "a component" means one or more components, and thus, possibly, more than one component is contemplated and can be employed or used in an implementation of the described methods, systems, and devices. Further, the use of a singular noun includes the plural, and the use of a plural noun includes the singular, unless the context of the usage requires otherwise.

What is claimed is:

1. A process for producing a photovoltaic module comprising:
   suspending a photovoltaic cell matrix comprising a plurality of electrically interconnected photovoltaic cells, wherein front sides of the photovoltaic cells face upward when suspended;
   positioning a backsheet and a first encapsulant layer underneath the suspended photovoltaic cell matrix;
   lowering the suspended photovoltaic cell matrix into contact with the first encapsulant layer, wherein back sides of the photovoltaic cells contact the first encapsulant layer;
   applying a second encapsulant layer over at least the front sides of the photovoltaic cells and electrical interconnections;
   positioning a front transparency onto the second encapsulant layer; and
   curing the first encapsulant layer and the second encapsulant layer.

2. The process of claim 1, further comprising applying the first encapsulant layer onto the backsheet, wherein the backsheet comprises a rim around a perimeter of the backsheet, the rim surrounding the first encapsulant layer.

3. The process of claim 2, wherein the backsheet comprises a pre-formed polymer sheet, and the first encapsulant layer comprises a liquid encapsulant.

4. The process of claim 1, wherein suspending the photovoltaic cell matrix comprises lifting the photovoltaic cells with a cell press comprising a vacuum system operably connected to apertures in a vertically-movable press plate, wherein the apertures contact the front sides of the photovoltaic cells and vacuum pressure applied through the apertures secures the photovoltaic cells to the press plate.

5. The process of claim 4, further comprising lowering the press plate until the back sides of the photovoltaic cells contact the first encapsulant layer; discontinuing the applied vacuum pressure from the apertures, thereby releasing the photovoltaic cell matrix from the press plate; and raising the press plate away from the photovoltaic cell matrix.

6. The process of claim 1, further comprising introducing inert gas between the suspended photovoltaic cell matrix and the first encapsulant layer.

7. The process of claim 6, further comprising providing a hermetically sealed chamber surrounding the suspended photovoltaic cell matrix, the backsheet, and the first encapsulant layer, wherein introducing the inert gas comprises purging the hermetically sealed chamber with the inert gas to create an inert gas atmosphere between the suspended photovoltaic cell matrix and the first encapsulant layer.

8. The process of claim 1, wherein applying the second encapsulant layer over at least the front sides of the photovoltaic cells and the electrical interconnections comprises applying a clear liquid encapsulant layer over the photovoltaic cell matrix and the first encapsulant layer.

9. The process of claim 1, wherein the backsheet comprises a rim around a perimeter of the backsheet, the rim surrounding the first encapsulant layer, the photovoltaic cell matrix, the second encapsulant layer, and the front transparency.

10. The process of claim 1, wherein positioning the front transparency onto the second encapsulant layer comprises:
lifting the front transparency with a press comprising a vacuum system operably connected to apertures in a vertically-movable press plate, wherein the apertures contact a front side of the front transparency and vacuum pressure applied through the apertures secures the front transparency to the press plate;
positioning the backsheet underneath the suspended front transparency, wherein the photovoltaic cell matrix is positioned on the backsheet and between the first encapsulant layer and the second encapsulant layer;
applying a vacuum between the suspended front transparency and the second encapsulant layer;
lowering the press plate until a back side of the front transparency contacts the second encapsulant layer;
maintaining the vacuum as the front transparency contacts the second encapsulant layer;
discontinuing the applied vacuum pressure from the apertures after the front transparency contacts the second encapsulant layer, thereby releasing the front transparency from the press plate; and
raising the press plate away from the front transparency.

11. The process of claim 1, wherein positioning the front transparency onto the second encapsulant layer comprises:
lifting the front transparency with a robotic system;
placing a first end of the front transparency in contact with the second encapsulant layer adjacent to a first end of the backsheet, wherein the front transparency is positioned at an angle relative to the second encapsulant layer;
tilting the front transparency to reduce the angle between the front transparency and the second encapsulant layer until a second opposite end of the front transparency contacts the second encapsulant layer adjacent to a second opposite end of the backsheet and there is a zero angle between the front transparency and the second encapsulant layer.

12. The process of claim 11, further comprising applying a vacuum between the front transparency and the second encapsulant layer, and maintaining the vacuum as the front transparency is tilted into contact with the second encapsulant layer.

13. The process of claim 1, wherein curing the first encapsulant layer and the second encapsulant layer comprises simultaneously curing both layers after positioning the front transparency.

14. A process for producing a photovoltaic module comprising:
suspending a photovoltaic cell with a front side of the photovoltaic cell facing upward;
positioning a backsheet and a first encapsulant layer underneath the suspended photovoltaic cell;
lowering the suspended photovoltaic cell into contact with the first encapsulant layer in an inert gas atmosphere, wherein a back side of the photovoltaic cell contacts the first encapsulant layer;
applying a second encapsulant layer over at least the front side of the photovoltaic cell;
positioning a front transparency onto the second encapsulant layer; and
curing the first encapsulant layer and the second encapsulant layer.

15. The process of claim 14, wherein suspending the photovoltaic cell comprises lifting the photovoltaic cell with a cell press comprising a vacuum system operably connected to an aperture in a vertically-movable press plate, wherein the aperture contacts the front side of the photovoltaic cell and vacuum pressure applied through the aperture secures the photovoltaic cell to the press plate.

16. The process of claim 15, further comprising lowering the press plate until the back side of the photovoltaic cell contacts the first encapsulant layer; discontinuing the applied vacuum pressure from the aperture, thereby releasing the photovoltaic cell from the press plate; and raising the press plate away from the photovoltaic cell.

17. The process of claim 14, wherein positioning the front transparency onto the second encapsulant layer comprises:
lifting the front transparency with a press comprising a vacuum system operably connected to apertures in a vertically-movable press plate, wherein the apertures contact a front side of the front transparency and vacuum pressure applied through the apertures secures the front transparency to the press plate;
positioning the backsheet underneath the suspended front transparency, wherein the photovoltaic cell matrix is positioned on the backsheet and between the first encapsulant layer and the second encapsulant layer;
applying a vacuum between the suspended front transparency and the second encapsulant layer;
lowering the press plate until a back side of the front transparency contacts the second encapsulant layer;
maintaining the vacuum as the front transparency contacts the second encapsulant layer;
discontinuing the applied vacuum pressure from the apertures after the front transparency contacts the second encapsulant layer, thereby releasing the front transparency from the press plate; and
raising the press plate away from the front transparency.

18. The process of claim 14, wherein positioning the front transparency onto the second encapsulant layer comprises:
lifting the front transparency with a robotic system;
placing a first end of the front transparency in contact with the second encapsulant layer adjacent to a first end of the backsheet, wherein the front transparency is positioned at an angle relative to the second encapsulant layer;
tilting the front transparency to reduce the angle between the front transparency and the second encapsulant layer until a second opposite end of the front transparency contacts the second encapsulant layer adjacent to a second opposite end of the backsheet and there is a zero angle between the front transparency and the second encapsulant layer.

19. The process of claim 14, wherein curing the first encapsulant layer and the second encapsulant layer comprises simultaneously curing both layers after positioning the front transparency.

20. The process of claim 14, further comprising introducing inert gas between the suspended photovoltaic cell and the first encapsulant layer in a hermetically sealed chamber to create the inert gas atmosphere.

* * * * *